United States Patent
Zeng et al.

(10) Patent No.: US 11,101,332 B2
(45) Date of Patent: Aug. 24, 2021

(54) OLED DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Yang Zeng, Shanghai (CN); Qijun Yao, Shanghai (CN); Xingyao Zhou, Shanghai (CN); Lihua Wang, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 298 days.

(21) Appl. No.: 15/478,809

(22) Filed: Apr. 4, 2017

(65) Prior Publication Data
US 2017/0207279 A1 Jul. 20, 2017

(30) Foreign Application Priority Data
Nov. 22, 2016 (CN) .......................... 201611041708.7

(51) Int. Cl.
*G06F 3/041* (2006.01)
*G06F 3/044* (2006.01)
(Continued)

(52) U.S. Cl.
CPC .......... *H01L 27/323* (2013.01); *G06F 3/0412* (2013.01); *G06F 3/0443* (2019.05);
(Continued)

(58) Field of Classification Search
CPC ..... G02F 1/13338; G02F 2001/133334; G02F 1/133528; G02F 2001/133638;
(Continued)

(56) References Cited

U.S. PATENT DOCUMENTS 6,219,122 B1 * 4/2001 Uchida ............. G02F 1/133634
252/299.1
6,738,117 B2 * 5/2004 Minakuchi .......... G02F 1/13363
349/118

(Continued)

FOREIGN PATENT DOCUMENTS

CN 1413069 A 4/2003
CN 103257731 A 8/2013
(Continued)

*Primary Examiner* — Michael J Jansen, II
(74) *Attorney, Agent, or Firm* — Anova Law Group, PLLC

(57) ABSTRACT

An OLED display panel and a display device are provided. The OLED display panel includes an array substrate, a circular polarizing plate disposed on one side of the array substrate, a first stack structure disposed between the array substrate and the circular polarizing plate, and at least one touch-control electrode layer disposed on one side of the first stack structure facing towards and/or facing away the circular polarizing plate. The first stack structure comprising at least one touch-control electrode substrate and at least one compensation film. A sum of phase retardation of the at least one touch-control electrode substrate and the at least one compensation film with respect to a beam of light at a same frequency is smaller than or equal to a predetermined value.

15 Claims, 13 Drawing Sheets

(51) Int. Cl.
*H01L 27/32* (2006.01)
*H01L 51/00* (2006.01)

(52) U.S. Cl.
CPC ........ *G06F 3/0445* (2019.05); *H01L 51/0097* (2013.01); *G06F 2203/04103* (2013.01)

(58) Field of Classification Search
CPC ............. G02F 1/1333; G02F 1/133504; G02F 1/133502; G02F 1/133753; G06F 3/044; G06F 2203/04103; G06F 3/041; G06F 3/0443; G06F 3/0445; G06F 3/0412; H01L 51/00; H01L 27/32; H01L 27/323; H01L 51/0097
See application file for complete search history.

(56) References Cited

U.S. PATENT DOCUMENTS

| | | | | |
|---|---|---|---|---|
| 7,067,985 | B2 * | 6/2006 | Adachi | G02B 5/3016 313/112 |
| 7,215,839 | B2 * | 5/2007 | Kawahara | G02B 5/3083 349/117 |
| 9,091,814 | B2 * | 7/2015 | Kang | G02B 5/3025 |
| 9,122,362 | B2 * | 9/2015 | Park | G06F 3/0445 |
| 9,207,796 | B2 * | 12/2015 | Park | G02F 1/13338 |
| 9,312,517 | B2 * | 4/2016 | Drzaic | H01L 51/5281 |
| 9,786,724 | B2 * | 10/2017 | Choi | H01L 27/3232 |
| 10,003,048 | B2 * | 6/2018 | Kim | H01L 51/5281 |
| 10,181,584 | B2 * | 1/2019 | Lee | H01L 51/5281 |
| 10,192,939 | B2 * | 1/2019 | Wang | H01L 27/323 |
| 10,283,735 | B2 * | 5/2019 | Kim | H01L 27/3211 |
| 10,381,419 | B2 * | 8/2019 | Lee | H01L 51/5246 |
| 10,490,612 | B2 * | 11/2019 | Choi | H01L 27/3232 |
| 2002/0047969 | A1 * | 4/2002 | Minakuchi | G02F 1/13338 349/117 |
| 2004/0051445 | A1 * | 3/2004 | Adachi | H01L 51/5281 313/504 |
| 2006/0028601 | A1 * | 2/2006 | Kawahara | G02B 27/286 349/117 |
| 2010/0134448 | A1 * | 6/2010 | Park | G06F 3/0412 345/176 |
| 2013/0016047 | A1 * | 1/2013 | Masumoto | G02F 1/13338 345/173 |
| 2013/0127742 | A1 * | 5/2013 | Kang | G02B 5/3025 345/173 |
| 2013/0194205 | A1 * | 8/2013 | Park | G06F 3/047 345/173 |
| 2013/0278511 | A1 | 10/2013 | Kang | |
| 2013/0335344 | A1 * | 12/2013 | Han | G06F 3/047 345/173 |
| 2014/0265822 | A1 * | 9/2014 | Drzaic | H01L 51/5284 313/504 |
| 2014/0354591 | A1 * | 12/2014 | Chu | G06F 3/044 345/174 |
| 2016/0056215 | A1 * | 2/2016 | Choi | G02B 5/3016 257/40 |
| 2016/0308170 | A1 * | 10/2016 | Kim | G02B 1/14 |
| 2016/0351631 | A1 * | 12/2016 | Lee | H01L 51/5284 |
| 2017/0125743 | A1 * | 5/2017 | Kim | H01L 27/3244 |
| 2017/0222188 | A1 * | 8/2017 | Lee | H01L 51/56 |
| 2017/0301736 | A1 * | 10/2017 | Wang | H01L 27/323 |
| 2018/0047797 | A1 * | 2/2018 | Choi | H01L 27/3211 |

FOREIGN PATENT DOCUMENTS

| | | |
|---|---|---|
| CN | 103389823 A | 11/2013 |
| CN | 204166503 U | 2/2015 |
| CN | 105912161 A | 8/2016 |

* cited by examiner

OLED DISPLAY PANEL AND DISPLAY DEVICE

CROSS-REFERENCES TO RELATED APPLICATIONS

This application claims priority of Chinese Patent Application No. 201611041708.7, filed on Nov. 22, 2016, the entire contents of which are hereby incorporated by reference.

FIELD OF THE DISCLOSURE

The present disclosure generally relates to the field of display technology and, more particularly, relates to an organic light-emitting diode (OLED) display panel and a display device.

BACKGROUND

FIG. 1 illustrates an existing OLED display device. As shown in FIG. 1, the existing OLED display panel comprises an array substrate 01, a touch-control electrode layer 02, a touch-control electrode substrate 03, a circular polarizing plate 04, and a cover plate 05. The array substrate 01 further includes a substrate 011, a light-emitting layer including RGB (red, green, and blue) sub-pixels 012 disposed on the substrate 011, and a thin film encapsulation (TFE) layer 013 covering the light-emitting layer 012.

Further, the touch-control electrode substrate 03 is generally made of a material having a phase retardation value $R_{th}$ of nearly zero with respect to the incident light, such as cyclic olefin polymer (COP). Further, by disposing the circular polarizing plate 04 on one side of the touch-control electrode layer 02 facing away the array substrate 01, the circular polarizing plate 04 reduces the reflected light from the touch-control electrode layer 02 and the cathodes in the RGB sub-pixels 102.

However, the COP material applied to the flexible OLED display devices shows a relatively high cost and a relatively large thickness. Further, the COP material may be quite fragile and thus cannot be processed or bent with ease. On the other hand, if other substrates having a relatively large phase retardation are used, such as a flexible material including polyethylene terephthalate (PET) or polyimide (PI), the material cost and the thickness may be both reduced, and the flexibility of the touch-control electrode substrate may be effectively improved. But, when viewed from an inclined angle, the circular polarizing plate may, however, show a relatively poor reflection-reducing effect on the reflected light from the metal disposed between the circular polarizing plate and the substrate of the array substrate.

The disclosed OLED display panel and display device are directed to solving at least partial problems set forth above and other problems.

BRIEF SUMMARY OF THE DISCLOSURE

One aspect of the present disclosure provides an OLED display panel. The OLED display panel includes an array substrate, a circular polarizing plate disposed on one side of the array substrate, a first stack structure disposed between the array substrate and the circular polarizing plate, and at least one touch-control electrode layer disposed on one side of the first stack structure facing towards and/or facing away the circular polarizing plate. The first stack structure comprising at least one touch-control electrode substrate and at least one compensation film. A sum of phase retardation of the at least one touch-control electrode substrate and the at least one compensation film with respect to a beam of light at a same frequency is smaller than or equal to a predetermined value.

Another aspect of the present disclosure provides a display device including an OLED display panel. The OLED display panel includes an array substrate, a circular polarizing plate disposed on one side of the array substrate, a first stack structure disposed between the array substrate and the circular polarizing plate, and at least one touch-control electrode layer disposed on one side of the first stack structure facing towards and/or facing away the circular polarizing plate. The first stack structure comprising at least one touch-control electrode substrate and at least one compensation film. A sum of phase retardation of the at least one touch-control electrode substrate and the at least one compensation film with respect to a beam of light at a same frequency is smaller than or equal to a predetermined value.

Other aspects of the present disclosure can be understood by those skilled in the art in light of the description, the claims, and the drawings of the present disclosure.

BRIEF DESCRIPTION OF THE DRAWINGS

To make more clearly the explanation of technical solution in embodiments of the present disclosure, drawings needed in the embodiments or current techniques are briefly illustrated below. Apparently, the drawings described below only correspond to some embodiments of the present disclosure, and it is possible for those ordinarily skilled in the art to derive other drawings from the accompanying drawings without creative effort.

DETAILED DESCRIPTION

The technical solutions in the embodiments of the present disclosure will be described as follows with reference to the accompanying drawings in the embodiments of the present disclosure. Clearly, the embodiments described below are merely a part of, rather than entire, embodiments of the present invention. On the basis of the embodiments of the present disclosure, other embodiments obtainable by those ordinarily skilled in the art without creative effort shall fall within the protection scope of the present invention.

In existing technologies, a touch-control electrode substrate in an OLED display device is often made of polyethylene terephthalate (PET) or polyimide (PI), thereby showing features of a low cost and good flexibility, etc. However, PI having a relatively small phase retardation (e.g., a phase retardation value $R_{th}$<100 nm) may show a relatively high coefficient of thermal expansion (CTE). Accordingly, because high-temperature processing exists during the fabrication process of touch-control electrodes for the OLED display panels, the high temperature may cause PI having a small phase retardation to expand or deform. Thus, PI having a small phase retardation may not be used as the touch-control electrode substrate for OLED display panels.

Figure 1:
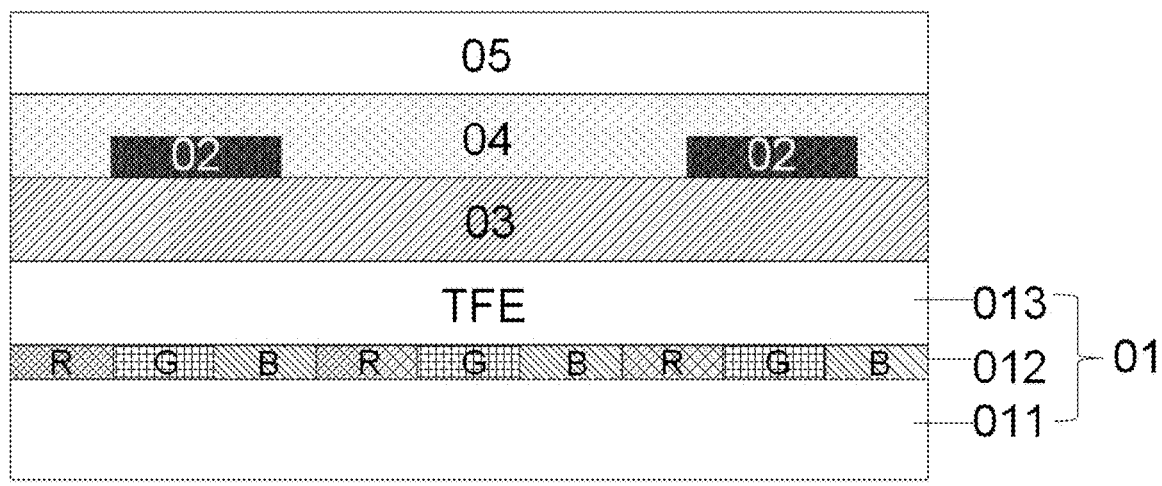
FIG. 1 illustrates a cross-sectional view of an existing OLED display panel.
Figure 2:
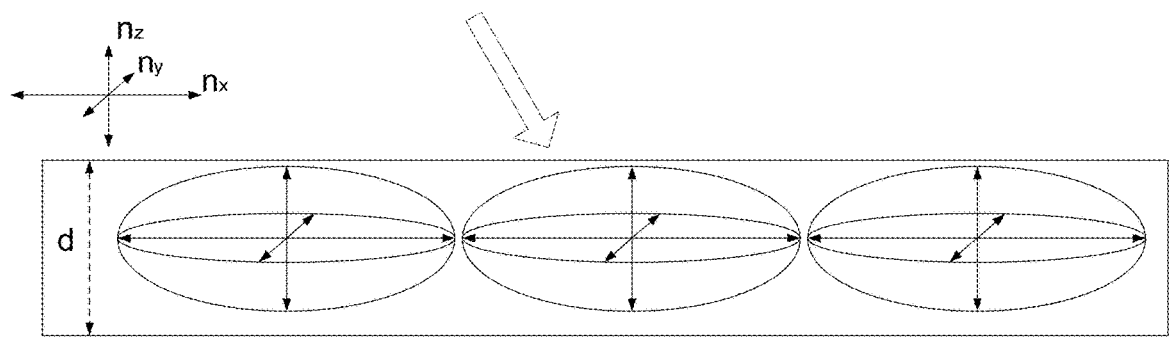
FIG. 2 illustrates a schematic view of impact of an exemplary touch-control electrode substrate on a reflection-reducing effect of a circular polarizing plate when viewed from an inclined angle.

Among PI materials with a thickness of approximately 10 μm, PI with a small CTE often has a relatively high phase retardation $R_{th}$ (e.g., $R_{th}$>1000 nm). FIG. 2 illustrates a schematic view of impact of an exemplary touch-control electrode substrate on a reflection-reducing effect of a circular polarizing plate when viewed from an inclined angle.

As shown in FIG. 2, d is the thickness of the touch-control electrode substrate, the ellipses represent refractive index ellipsoids, and at a front viewing angle, the phase retardation of the touch-control electrode substrate may be expressed as:

$$R_0 = (n_x - n_y)d.$$

Where, $n_x$ is a refractive index of the touch-control electrode substrate along an X direction, $n_y$ is a refractive index of the touch-control electrode substrate along a Y direction, and d is the thickness of the touch-control electrode substrate.

At an inclined viewing angle, a refractive index of the touch-control electrode substrate along a Z direction may also affect the circular polarization of the reflected light from a metal, and the phase retardation becomes:

$$R_{th} = \left(\frac{n_x + n_y}{2} - n_z\right)d.$$

Where, $n_x$ is the refractive index of the touch-control electrode substrate along the X direction, $n_y$ is the refractive index of the touch-control electrode substrate along the Y direction, and $n_z$ is a refractive index of the touch-control electrode substrate along a Z direction. Similarly, d is the thickness of the touch-control electrode substrate.

In existing technologies, a circular polarizing plate often includes a ¼ wavelength plate (called named quarter-wave plate) and a linear polarizing plate. The ¼ wavelength plate may add a 90-degree phase (¼ wavelength) retardation to a light incident on the circular polarizing plate, thereby converting the incident light to a circularly-polarized light. After being reflected, for example, by a touch-control electrode layer, and again passes through the ¼ wavelength plate, the circularly-polarized light is converted to a linearly polarized light showing a polarization direction perpendicular to the polarization direction of the incident light and is therefore entirely absorbed by the linear polarizing plate. Accordingly, a reflection-reducing effect is achieved.

Such a property of the circular polarizing plate may be relied on the accuracy of the additional 90-degree phase retardation. If the additional phase is greater than or smaller than 90 degrees, the incident light may be converted into elliptically polarized light and thus may not be completely absorbed after reflection, thereby increasing reflection.

Figure 3:
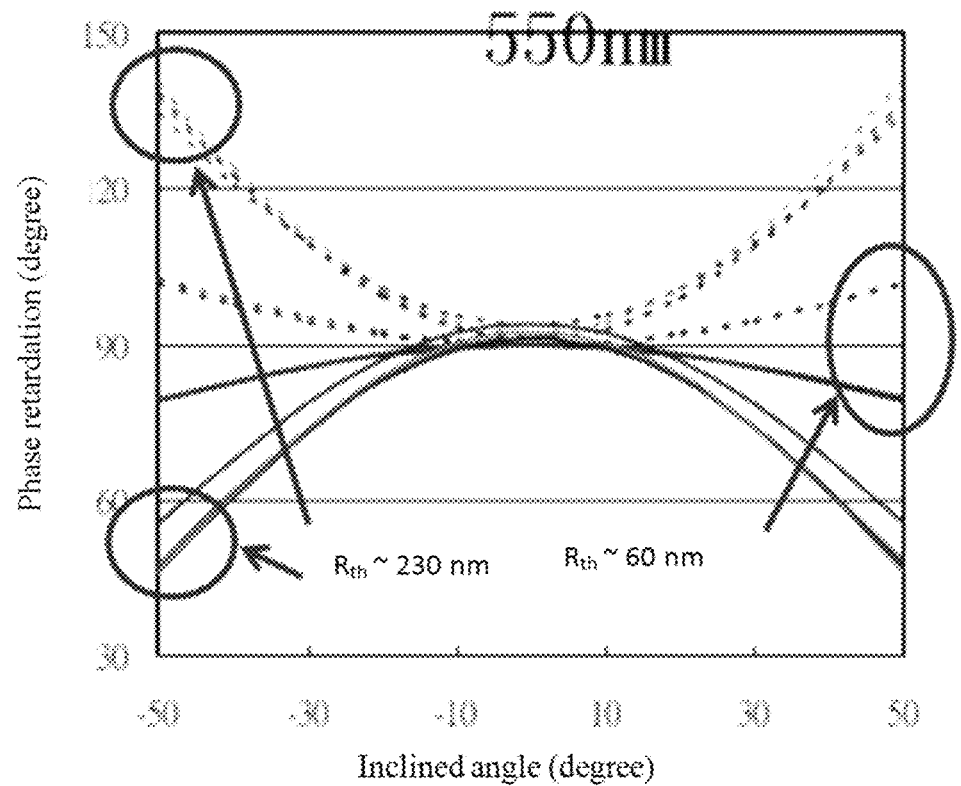
FIG. 3 illustrates a relational diagram between an inclined viewing angle of an exemplary OLED display panel and phase retardation according to embodiments of the present disclosure.

After a PI substrate is introduced, properties of $n_x$, $n_y$, and $n_z$ of the PI substrate may add additional phase retardation to the obliquely incident light, thereby disturbing the normal operational conditions of the ¼ wavelength plate. FIG. 3 illustrates a relational diagram between an inclined viewing angle and phase retardation of an exemplary OLED display panel according to embodiments of the present disclosure.

As shown in FIG. 3, the horizontal coordinate represents an inclined angle (i.e., incident angle), and the longitudinal coordinate represents a total phase retardation value when the introduced PI substrate and the ¼ wavelength plate are calculated together. In particular, when the longitudinal coordinate equals to 90 degree, the corresponding total phase retardation value may indicate that the operation of the ¼ wavelength plate may not be influenced.

Further, as indicated by experimental data collected and shown in FIG. 3, the additional phase retardation may mainly depend on two parameters: (1) the incident angle; and (2) the phase retardation $R_{th}$ of the PI substrate. More specifically, the greater the incident angle, the greater the additional phase retardation. Similarly, at the same incident angle, the greater the Rib of the PI substrate, the greater the additional phase retardation.

Further, referring to FIG. 3, when the inclined angle (e.g., ±50°) or the $R_{th}$ (e.g., 230 nm) increases, the total phase retardation of the incident light may deviate more from 90 degrees. Thus, the reflection becomes higher, and the reflection-reducing effect turns poorer. Accordingly, if a material with a relatively small CTE is used to fabricate the touch-control electrode substrate, at an inclined viewing angle, the reflection-reducing effect of the circular polarizing plate on the reflected light from the metal between the circular polarizing plate and the substrate of the array substrate may be impacted.

Further, referring to FIG. 3, the unit of the phase retardation is degree, while the unit of the phase retardation $R_{th}$ according to the present disclosure is a length unit (i.e., nm). Denoted by φ, an equation of phase retardation commonly known to those skilled in the art is:

$$\varphi = \frac{2\pi d}{\lambda/n(\lambda)} = \frac{2\pi}{\lambda} * n(\lambda) * d.$$

Where, λ is a wavelength of a light wave in vacuum, n(λ) is a refractive index of a material indicating that n is dependent of λ, and d represents the path length of the light independent of the wavelength of the light. Thus, the wavelength of the light in the material may be expressed by $\lambda/n(\lambda)$, and the phase retardation $R_{th}$ may be represented by $n(\lambda)*d$. Accordingly, the phase retardation $R_{th}$ and the phase retardation $\varphi$ may only differ by a factor of $2\pi/\lambda$ (wave number). Further, as a dimension that evaluates the impact of the substrate material on the phase retardation of a beam of light at a specific frequency in an inclined viewing angle, $R_{th}$ is therefore named phase retardation.

Based on the aforementioned descriptions, the present disclosure provides an OLED display panel. The OLED display panel may include an array substrate, a circular polarizing plate, a first stack structure sandwiched between the array substrate and the circular polarizing plate, and at least one touch-control electrode layer. The at least one touch-control electrode layer may be disposed on one side of the first stack structure facing towards the circular polarizing plate and/or facing away the circular polarizing plate.

More specifically, the circular polarizing plate may be disposed on one side of the array substrate. The first stack structure may further include a touch-control electrode substrate and a compensation film. In particular, the sum of the phase retardation of the touch-control electrode substrate and the compensation film with respect to the beam of light at the same frequency is smaller than or equal to 200 nm.

The present disclosure is not intended to limit the stacking order of the touch-control electrode substrate and the compensation film included in the first stack structure. Further, the number of the touch-control electrode substrates and the number of the compensation films are not limited and may be selected according to practical needs. Optionally, the number of the touch-control electrode substrates may be one or two, and the number of the compensation films may be one or more.

Optionally, the number of the touch-control electrode substrates is one, and the number of the compensation films is also one. Further, the sum of the thicknesses of the touch-control electrode substrate and the compensation film may be smaller than the thickness of an existing touch-control electrode substrate made of a COP material.

Because the compensation film is introduced to compensate for the phase retardation of the touch-control electrode substrate, the phase retardation of the first stack structure may be relatively small. Accordingly, at an inclined viewing angle, the reflection-reducing effect of the circular polarizing plate on the reflected light from the metal between the circular polarizing plate and the substrate of the array substrate in the OLED display panel may not be impacted. Thus, the reflection-reducing effect of the circular polarizing plate at an inclined viewing angle may be greatly improved.

The basic concepts and principles applied in the present disclosure may include uniaxial materials and anisotropic materials. Further, referring to FIG. 2, in the case of anisotropic materials, the refractive indices (i.e., $n_x$, $n_y$, and $n_z$) along the X direction, the Y direction, and the Z direction are different. That is, in anisotropic materials, $n_x \neq n_y \neq n_o$. Further, in the case of uniaxial materials, FIG. 14 illustrates existing optical indicatrix of uniaxial negative and positive materials.

Figure 14:
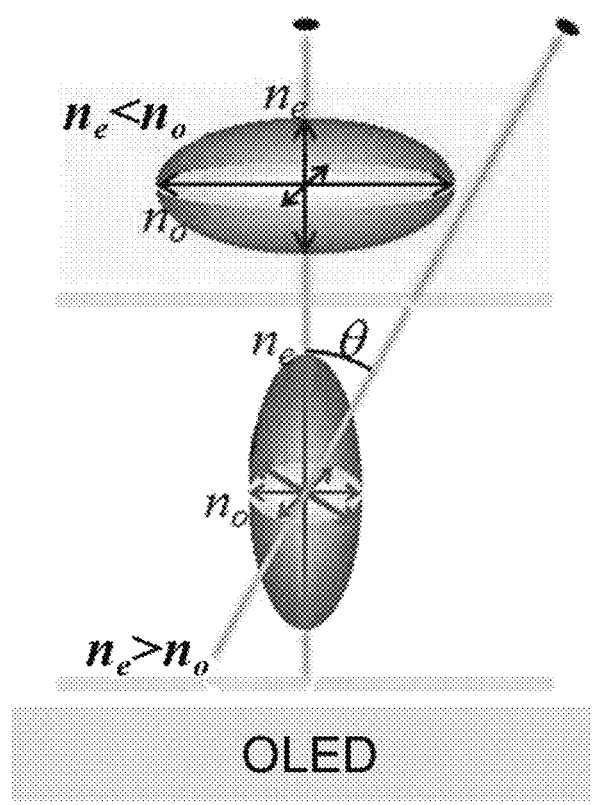
FIG. 14 illustrates existing optical indicatrix of uniaxial negative and positive materials.

As shown in FIG. 14, the refractive indices along the X direction and the Y direction are equal and are denoted $n_x=n_y=n_o$, and the refractive index along the Z-axis (the direction of optical axis) is denoted $n_z=n_e$, where $n_o$ is known as the ordinary refractive index and $n_e$ is called the extraordinary refractive index. When $n_e>n_o$, the uniaxial material is said to be positive uniaxial, and when $n_o>n_e$, the uniaxial material is said to be negative uniaxial.

At a perpendicular viewing angle, the phase retardation of a touch-control electrode substrate is:

$$R_0=(n_x-n_y)d=0.$$

Where $n_x$ is a refractive index of the touch-control electrode substrate along an X direction, $n_y$ is a refractive index of the touch-control electrode substrate along a Y direction, and d is a thickness of the touch-control electrode substrate.

At an inclined viewing angle, the phase retardation of the touch-control electrode substrate is:

$$R_{th} = \left(\frac{n_x+n_y}{2} - n_z\right)d \gg 0$$

Where, $n_x$ is a refractive index of the touch-control electrode substrate along an X direction, $n_y$ is a refractive index of the touch-control electrode substrate along a Y direction, and $n_z$ is a refractive index of the touch-control electrode substrate along a Z direction. Further, d is a thickness of the touch-control electrode substrate.

Further, at a perpendicular viewing angle, the phase retardation of the compensation film is:

$$R_0'=(n_x'-n_y')d'=0.$$

Where $n_x'$ is a refractive index of the compensation film along an X direction, $n_y'$ is a refractive index of the compensation film along a Y direction, and d' is the thickness of the compensation film.

Further, at an inclined viewing angle, the phase retardation of the compensation film is:

$$R_{th}' = \left(\frac{n_x'+n_y'}{2} - n_z'\right)d' \approx -R_{th} \ll 0.$$

Where $n_x'$ is the refractive index of the compensation film along an X direction, $n_y'$ is the refractive index of the compensation film along a Y direction, $n_z'$ is a refractive index of the compensation film along a Z direction, and d' is the thickness of the compensation film.

That is, the phase retardation $R_{th}'$ of the compensation film and the phase retardation $R_{th}$ of the touch-control electrode substrate may have approximately the same absolute value but opposite symbols. Optionally, the compensation film may be formed using a material such as a liquid crystal coating material. The present disclosure is not intended to limit the material of the compensation film.

That is, a compensation film may be applied to compensate for the phase retardation of a material suitable for fabricating a touch-control electrode substrate of an OLED display panel in existing technologies. Accordingly, a material of an OLED touch-control electrode substrate in existing technologies may be used to fabricate OLED display devices without affecting the reflection-reducing effect of the circular polarizing plate on the reflected light from the metal between the circular polarizing plate and the substrate of the array substrate in the OLED display panel at an inclined viewing angle. Thus, the flexibility of the touch-control electrode substrate may be effectively improved, thereby facilitating the processing of the OLED display devices.

Further, when the COP material is used to fabricate the touch-control electrode substrate in an existing OLED display panel, and most fabricated thin films may have a thickness of approximately 50 μm-100 μm. Optionally, the thickness of a few touch-control electrode substrates may be fabricated to be around 30 μm. The subsequent processing on the COP material, however, may be relatively difficult.

Further, in existing technologies, a material suitable for fabricating a touch-control electrode substrate, such as PI, is often coated on a glass substrate during a fabrication process. The thickness of the touch-control electrode substrate made of PI may be approximately 5 μm to 20 μm, and often around 10 μm. By controlling the thickness of the disclosed compensation film, the thickness of the OLED display panel may be reduced. Optionally, the thickness of the compensation film may also be approximately 10 μm.

In one embodiment, the compensation film with $R_{th}'<0$ may be utilized to compensate for the phase retardation of the touch-control electrode substrate, such that at an inclined viewing angle, the phase retardation of the touch-control electrode substrate and the phase retardation of the compensation film may be counteracted. Accordingly, the impact on the polarization of the circularly-polarized light emitted from the circular polarizing plate may be further reduced. Thus, the reflection-reducing effect of the circular polarizing plate may not be affected.

To make the technical solutions of the present disclosure easier to understand, the technical solutions in embodiments of the present disclosure will be described in a clear and complete manner with reference to the accompanying drawings in embodiments of the present disclosure.

Figure 4:
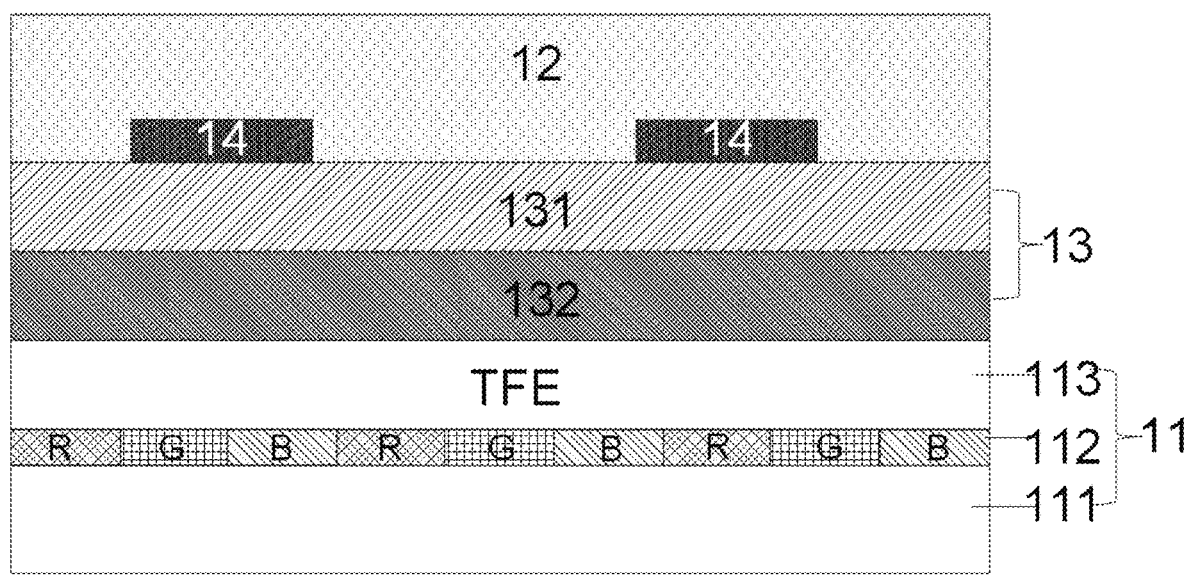
FIGS. 4-6 illustrate cross-sectional views of various exemplary OLED display panels according to embodiments of the present disclosure.
Figure 5:
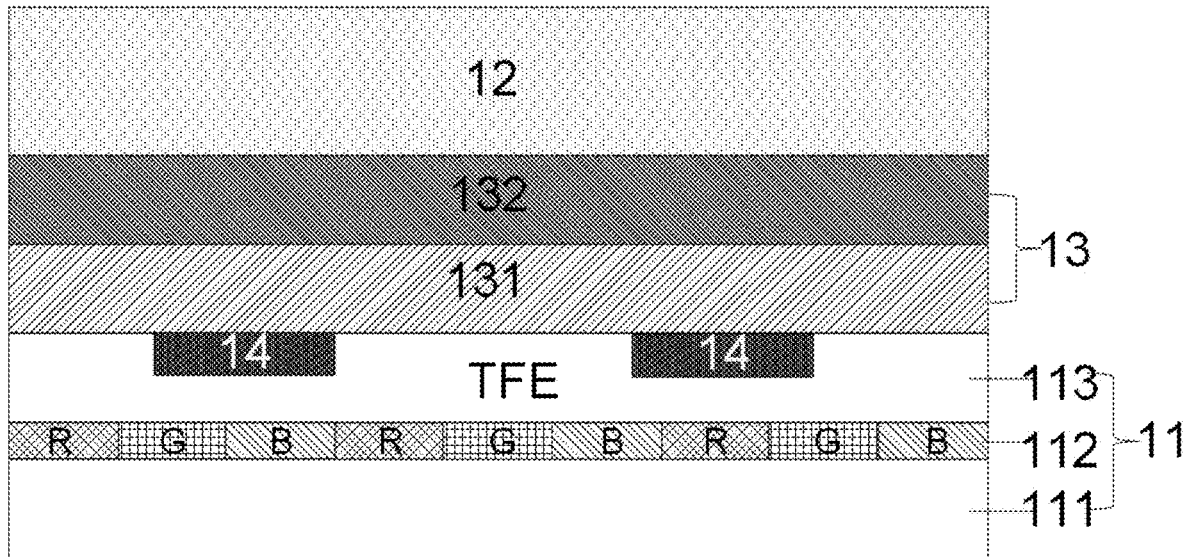
Figure 6:
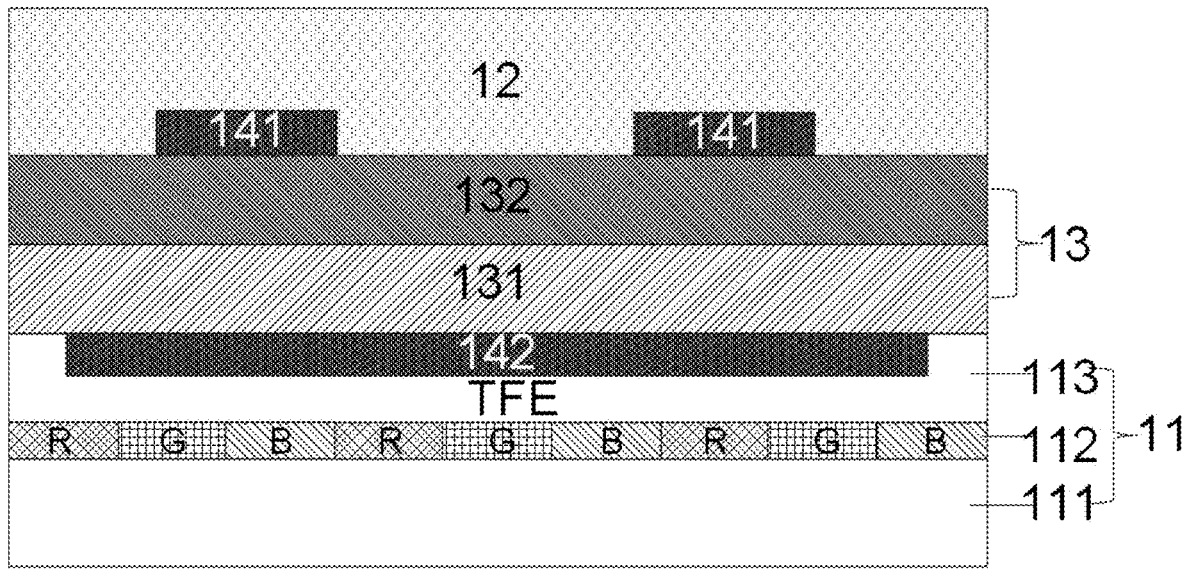

FIGS. 4-6 illustrate various exemplary OLED display panels according to embodiments of the present disclosure. As shown in FIG. 4, the OLED display panel may include an array substrate 11, a circular polarizing plate 12, a first stack structure 13, and a touch-control electrode layer 14. The array substrate 11 may further include a substrate 111, a plurality of RGB sub-pixels 112 on the substrate 111, and a thin film encapsulation (TFE) layer 113 on the plurality of RGB sub-pixels 112.

Further, the circular polarizing plate 12 may be disposed on one side of the array substrate 11. The first stack structure 13 may be sandwiched between the array substrate 1 and the circular polarizing plate 12. The touch-control electrode layer 14 may be disposed on one side of the first stack structure 13 facing towards the circular polarizing plate 12.

More specifically, the first stack structure 13 may further include a touch-control electrode substrate 131 and a compensation film 132. As shown in FIG. 4, the compensation film 132 may be, optionally, disposed on one side of the touch-control electrode substrate 131 facing away the circular polarizing plate 12. Optionally, the compensation film 132 may also be disposed on one side of the touch-control electrode substrate 131 facing towards the circular polarizing plate 12, as illustrated in FIG. 5. In particular, the sum of phase retardation of the touch-control electrode substrate 131 and the compensation film 132 with respect to the beam of light at the same frequency may be smaller than or equal to 200 nm.

Further, the present disclosure is not intended to limit the number of the touch-control electrode layers 14. For example, the number of touch-control electrode layers 14 may be one or may be two. When the OLED display panel includes one touch-control electrode layer 14, the present disclosure is not intended to limit the specific position of the touch-control electrode layer with respect to the first stack structure. For example, as shown in FIG. 4, the touch-control electrode layer 14 may be disposed on one side of the first stack structure 13 facing towards the circular polarizing plate 12. Optionally, as shown in FIG. 5, the touch-control electrode layer 14 may be disposed on one side of the first stack structure 13 facing away the circular polarizing plate 12.

Further, the OLED display panel may include two touch-control electrode layers. As shown in FIG. 6, the two touch-control electrode layers may include a first touch-control electrode layer 141 and a second touch-control electrode layer 142. In particular, the first touch-control electrode layer 141 may be disposed on one side of the first stack structure 13 facing towards the circular polarizing plate 12, and the second touch-control electrode layer 142 may be disposed on one side of the first stack structure 13 facing away the circular polarizing plate 12.

The present disclosure is not intended to limit whether the touch-control electrode layer is located on surface of the first stack structure, and other layer structures may be disposed between the touch-control electrode layer and the first stack structure. However, the present disclosure is not limited thereto. Optionally, the touch-control electrode layer may be fabricated on surface of the first stack structure.

In particular, as shown in FIG. 5, when the touch-control electrode layer 14 is located on one side of the first stack structure 13 facing away the circular polarizing plate 12, light reflected by the touch-control electrode layer 14 may enter the first stack structure 13, such that under the synthetic effect of the first stack structure 13 and the circular polarizing plate 12, the reflection-reducing effects on the light reflected by the touch-control electrode layer may be relatively good.

In schematic views of various exemplary OLED display panels, the touch-control electrodes may be disposed in positions relative to the touch-control electrode substrate 14 and the compensation film 132. For example, in FIG. 5, the touch-control electrodes may be single-layer, bridge-crossing, and mutual capacitive on a lower surface of the touch-control electrode substrate 131, or double-layer mutual capacitive, or single-layer self-capacitive, which is not repeatedly described herein.

In one embodiment, the sum of phase retardations of the touch-control electrode substrate 131 and the compensation film 132 with respect to the beam of light at the same frequency may be smaller than or equal to 200 nm. That is, for the beam of light at the same frequency, the sum of the phase retardation $R_{th}$ of the touch-control electrode substrate 131 and the phase retardation $R_{th}'$ of the compensation film 132 may be smaller than or equal to 200 nm.

While the sum of the phase retardations $R_{th}$ and $R_{th}'$ needs to be smaller than or equal to 200 nm, the phase retardation of the touch-control electrode substrate 131 may not be limited as long as the compensation film 132 controls the sum of the phase retardation $R_{th}$ and the phase retardation $R_{th}$ to be lower than 200 nm. Accordingly, in one embodiment, the touch-control electrode substrate 131 may be made of PI or PET. Further, PI with phase retardation $R_{th}$ greater than 300 nm may be used to fabricate the touch-control electrode substrate 131. Because the PI with a relatively large phase retardation $R_{th}$ and a relatively small CET may not easily deform when exposed to a high temperature during high thermal processing of the touch-control electrode layer 14 in the OLED display panel, the yield of the products is improved.

Figure 7A:
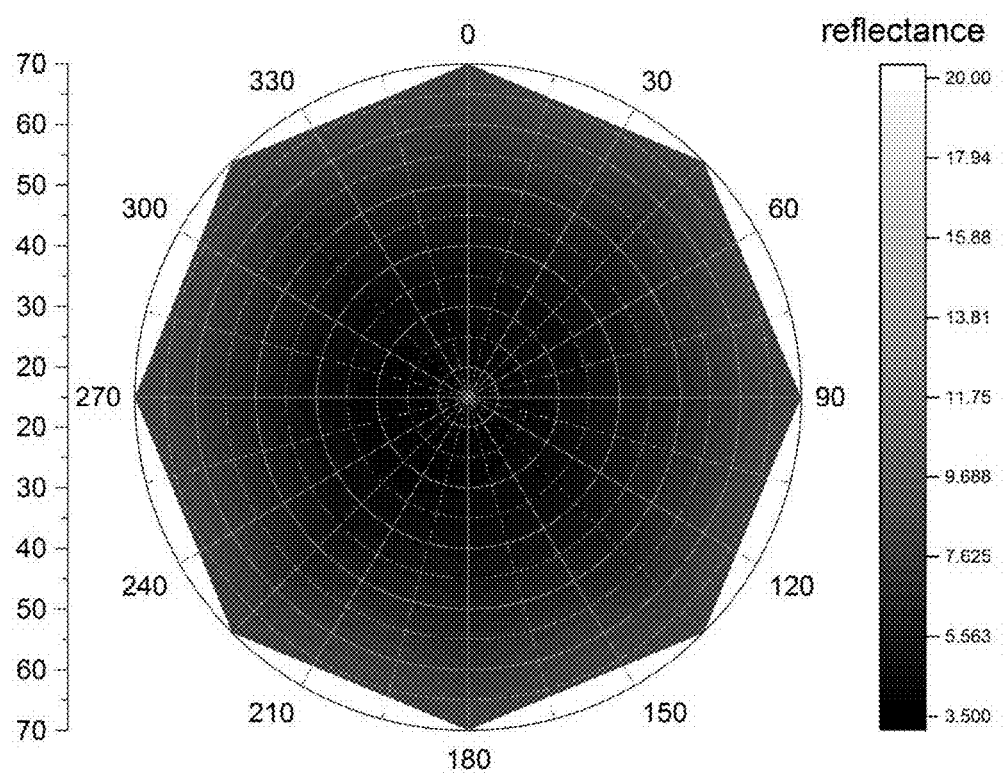
FIG. 7A illustrates an existing simulation diagram of mirror reflectance distribution when a touch-control electrode substrate is made of COP.
Figure 7B:
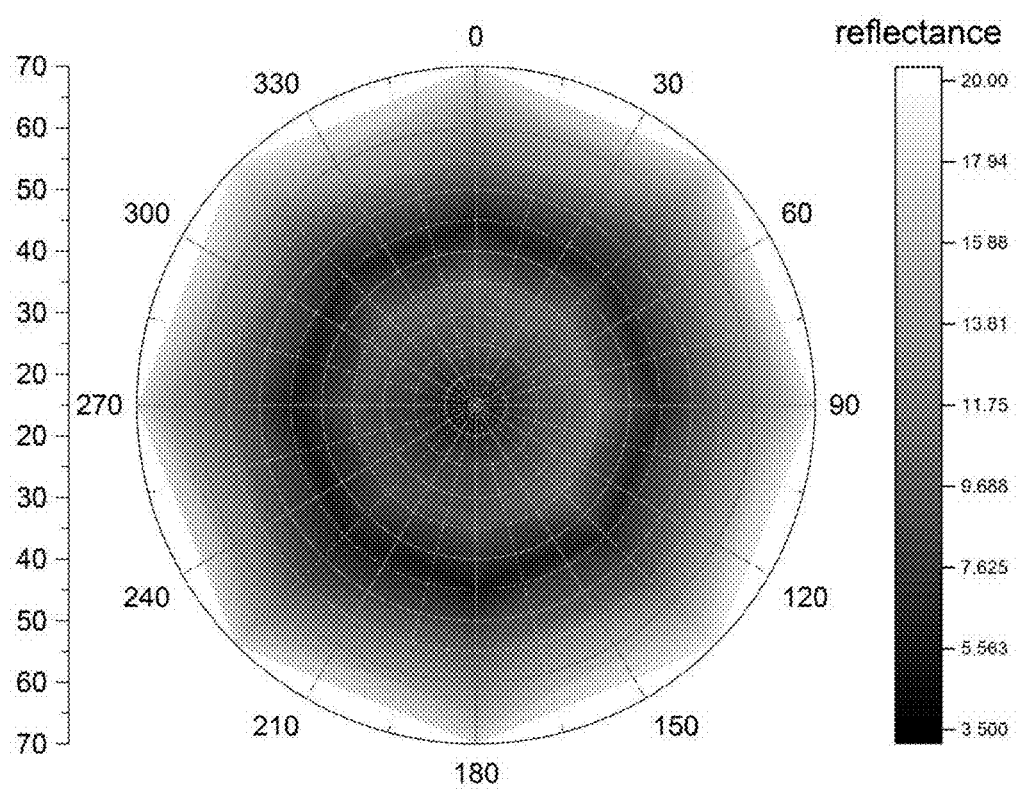
FIG. 7B illustrates an exemplary simulation diagram of mirror reflectance when a touch-control electrode substrate is a PI layer and no compensation film is used according to embodiments of the present disclosure.
Figure 7C:
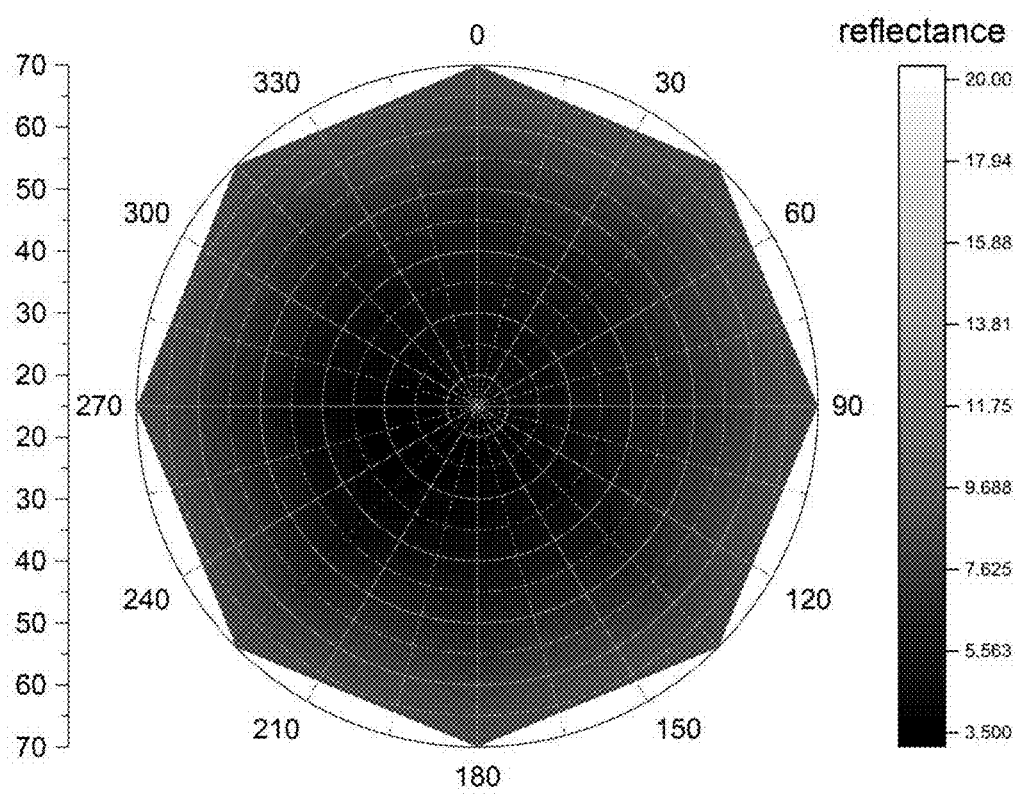
FIG. 7C illustrates an exemplary simulation diagram of mirror reflectance when a touch-control electrode substrate is a PI layer and a compensation film is used to compensate a phase retardation $R_{th}$ of the PI layer such that the sum of phase retardation of the PI substrate and the compensation film with respect to the beam of light beam at the same frequency is zero according to embodiments of the present disclosure.
Figure 7D:
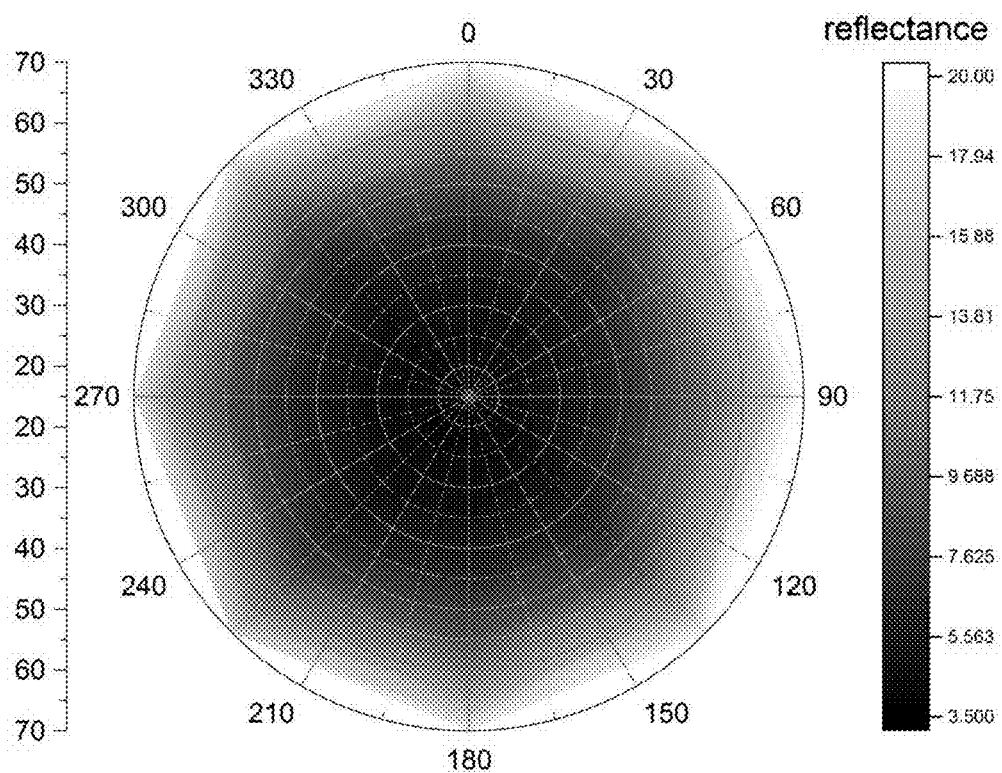
FIG. 7D illustrates an exemplary simulation diagram of mirror reflectance when a touch-control electrode substrate is a PI layer and a compensation film is used to compensate a phase retardation $R_{th}$ of the PI layer such that the sum of phase retardation of the PI substrate and the compensation film with respect to the beam of light at the same frequency is 110 nm according to embodiments of the present disclosure.

FIG. 7A illustrates a simulation diagram of mirror reflectance distribution when an existing touch-control electrode substrate is made of COP. FIG. 7B illustrates a simulation diagram of mirror reflectance distribution an exemplary touch-control electrode substrate is made of PI and no compensation film is used according to embodiments of the present disclosure;

Further, FIG. 7C illustrates a simulation diagram of mirror reflectance distribution when an exemplary touch-control electrode substrate is a PI layer and a compensation film is used to compensate for $R_{th}$ of PI such that the sum of phase retardation of the PI substrate and the compensation film with respect to the beam of light beam at the same frequency is zero according to embodiments of the present disclosure. FIG. 7D illustrates a simulation diagram of mirror reflectance distribution when an exemplary touch-control electrode substrate is a PI layer and a compensation film is used to compensate for the Rib of the PI substrate, such that the sum of phase retardation of the PI substrate and the compensation film with respect to the beam of light at the same frequency is 110 nm according to embodiments of the present disclosure.

As shown in FIGS. 7A-7D, numbers such as 0, 30, 60 . . . 330 in the central circular region may represent a circumferential direction on surface of the OLED display panel. The numbers 20, 30 . . . 70 on the left scale may represent the value of an inclined angle with respect to a direction perpendicular to the OLED display panel. For example, the central point of the central circular region may be a perpendicular viewing angle perpendicular to the OLED display panel, and the inclination angle at the central point may be zero.

Further, the reflectance scale on the right side may represent the reflectance of the OLED display panel, and a darker color may indicate a smaller reflectance. For example, the shallowest color may indicate a reflectance of approximately 20%, and the darkest color may indicate a reflectance of approximately 3.5%. Accordingly, as shown in FIG. 7A, the darker the color of the central circular region, the better the reflection-reducing effect of the OLED display panel.

Referring to FIG. 7B, when a PI layer is used as the touch-control electrode substrate and no compensation film is used to compensate for the phase retardation $R_{th}$ of the PI layer, reflectance of a part of the OLED display panel may be relatively high, and the reflection-reducing effect may be both relatively poor under the perpendicular viewing angle and most inclined viewing angles. Further, referring to FIG. 7D, when a compensation film is used to compensate for the $R_{th}$ of the PI layer such that the sum of phase retardation of the PI layer and the compensation film with respect to a beam of light at the same frequency is 110 nm, the reflection-reducing effect under the perpendicular viewing angle is relatively good, and the under an inclined viewing angle, the reflection-reducing effect is also better than that without compensation.

Further, referring to FIG. 7C, when a compensation film is used to compensate for the $R_{th}$ of the PI layer such that the sum of phase retardation of the PI layer and the compensation film with respect to the beam of light at the same frequency is 0 nm, the reflection-reducing effect is relatively good both under the perpendicular and inclined viewing angles, similar to that shown in FIG. 7A.

Through experiments and research experience, when the sum of phase retardation of the touch-control electrode substrate and the compensation film with respect to a beam of light at the same frequency is smaller than or equal to 200 nm, the reflectance at an inclined viewing angle may be acceptable. If the sum of phase retardation of the touch-control electrode substrate and the compensation film with respect to a beam of light at the same frequency is further reduced to be smaller than or equal to 50 nm, the reflectance is greatly reduced and the reflection-reducing effect is relatively good. That is, the smaller the sum of phase retardation of the touch-control electrode substrate and the compensation film with respect to a beam of light at the same frequency, the better the reflection-reducing effect.

Accordingly, during the fabrication process of the OLED display panels and the OLED display devices, a material of the touch-control electrode substrate and a material of the compensation film may be chosen to allow the sum of phase retardation of the touch-control electrode substrate and the compensation film with respect to a beam of light at the same frequency smaller than or equal to 50 nm. Optionally, the material of the touch-control electrode substrate and the material of the compensation film allowing the sum of phase retardation of the touch-control electrode substrate and the compensation film with respect to a beam of light at the same frequency to be equal to 0 may be chosen for fabrication of the OLED display panel.

In one embodiment, the compensation film may be solely attached on surface of the touch-control electrode substrate, or may be fabricated on surface of the touch-control electrode substrate. The present disclosure is not limited thereto. When in contact with the circular polarizing plate, the compensation film may also be solely attached on surface of the circular polarizing plate, or optionally, fabricated on surface of the touch-control electrode substrate. Further, when the compensation film is in contact with the TFE layer, the compensation film may be solely attached on or fabricated on surface of the TFE layer.

For example, in one embodiment, as shown in FIG. 5, the circular polarizing plate 12 may be tightly attached onto the compensation film 132, and the compensation film 132 and the circular polarizing plate 12 may be fabricated into an integral structure for ease of use. The compensation film 132 may be directly fabricated on surface of the circular polarizing plate 12. That is, after passing through the circular polarizing plate 12, the light beam may form a circularly-polarized light, and after passing through the compensation film 132, the circularly-polarized light may become an elliptical light showing a certain polarization state.

Further, after passing through the touch-control electrode substrate 131, the elliptical light may be recovered to be a circularly-polarized light. Accordingly, the reflection-reducing effect of the circular polarizing plate 12 on the reflected light from the metal between the circular polarizing plate 12 and the substrate 111 of the array substrate 11 may not be impacted at an inclined viewing angle.

The metal between the circular polarizing plate 12 and the substrate 111 of the array substrate 11 may be a touch-control electrode layer 14, a metallic anode on the OLED array substrate, or other metallic structures. As long as the reflected light from the metal traverses the first stack structure 13, the reflection-reducing effect of the circular polarizing plate 12 on the light beam may be relatively good.

In OLED display panel provided by embodiments of the present disclosure, the touch-control electrode substrate may be fabricated using a material such as PI, etc. Simultaneously, a compensation film may be used to compensate for the phase retardation $R_{th}$ of the material of the touch-control electrode substrate (e.g., PI). Accordingly, at an inclined viewing angle, the phase retardation of the touch-control electrode substrate and the phase retardation of the compensation film may be counteracted, thereby reducing the effect on the polarization of the circularly-polarized light emitted from the circular polarizing plate. Further, the reflection-reducing effect of the circular polarizing plate may not be impacted.

FIGS. 8-12 illustrate cross-sectional views of various OLED display panels according to embodiments of the present disclosure. As shown in FIGS. 8-12, the present disclosure also provides an OLED display panel. The first stack structure in the OLED display panel may, for example, include a plurality of compensation films, and one touch-control electrode substrate or two touch-control electrode substrates. When the OLED display panel includes two touch-control electrode substrates, optionally, the two touch-control electrode substrates may both be PI layers.

Further, materials of the plurality of compensation films may be the same or may be different, and the present disclosure is not limited thereto. Further, materials of the two touch-control electrode substrates may be the same or may be different. The present disclosure is not limited thereto, as long as the sum of the phase retardation of the touch-control electrode substrate and the compensation film with respect to a beam of light at the same frequency is smaller than or equal to 200 nm, or optionally, smaller than or equal to 50 nm. If allowed by the actual materials, the sum of phase retardation of the touch-control electrode substrate and the compensation film with respect to a beam of light beam at the same frequency may be 0 nm.

Figure 8:
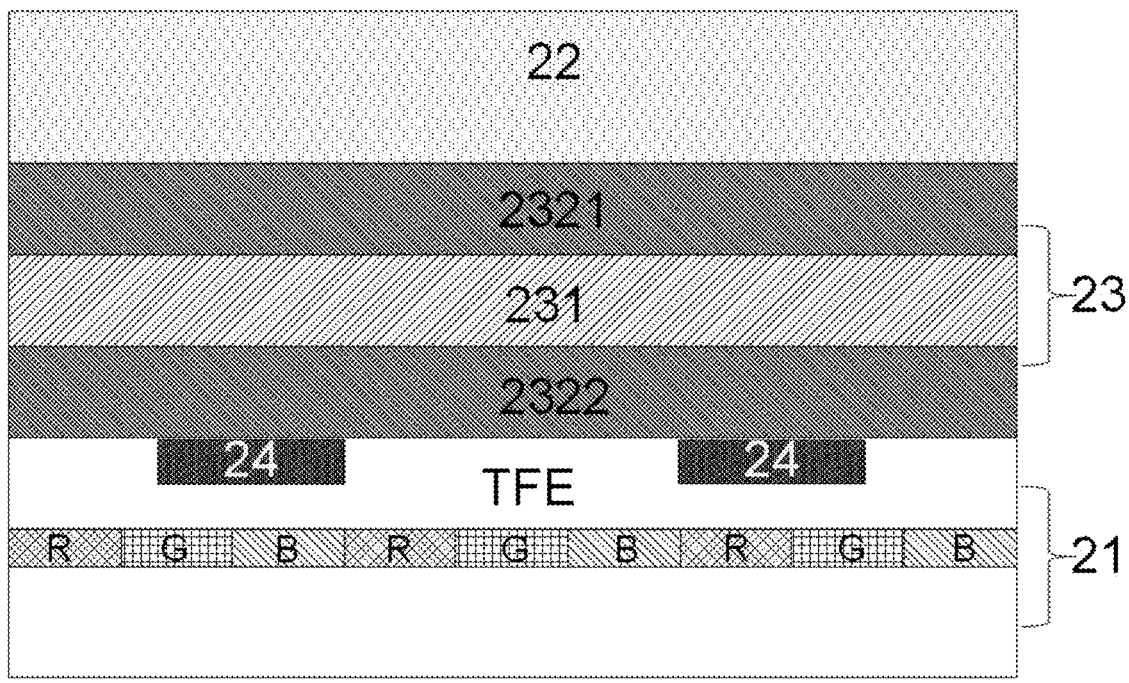
FIGS. 8-13 illustrate cross-sectional views of various OLED display panels according to embodiments of the present disclosure.

As shown in FIG. 8, the OLED display panel may include an array substrate 21, a circular polarizing plate 22, a first stack 23, and a touch-control electrode layer 24. The first stack structure 23 may include a touch-control electrode substrate 231, a first compensation film 2321, and a second compensation film 2322.

More specifically, the first compensation film 2321 may be disposed on one side of the touch-control electrode substrate 231 facing towards the circular polarizing plate 22, and the second compensation film 2322 may be disposed on one side of the touch-control electrode substrate 231 facing away the circular polarizing plate 22. FIG. 8 only illustrates a situation where the OLED display panel includes only one touch-control electrode layer, and the touch-control electrode layer 24 may be disposed on one side of the first stack structure 23 facing away the circular polarizing plate 22.

Based on FIG. 8, the touch-control electrode layer 24 in the OLED display panel may also be disposed on one side of the first stack structure 23 facing towards the circular polarizing plate 22. Optionally, the OLED display panel may further include two touch-control electrode layers 24, and the two touch-control electrode layers 24 may be disposed on one side of the first stack structure 23 facing towards the circular polarizing plate 22, and on one side of the first stack structure 23 facing away the circular polarizing plate 22, respectively.

Other structures illustrated in FIG. 8 may be the same or similar to aforementioned structures illustrated in FIG. 4, and are not described in detail herein. The material or thickness of each structure may also be the same as aforementioned material or thickness, and is not described in detail herein.

Figure 9:
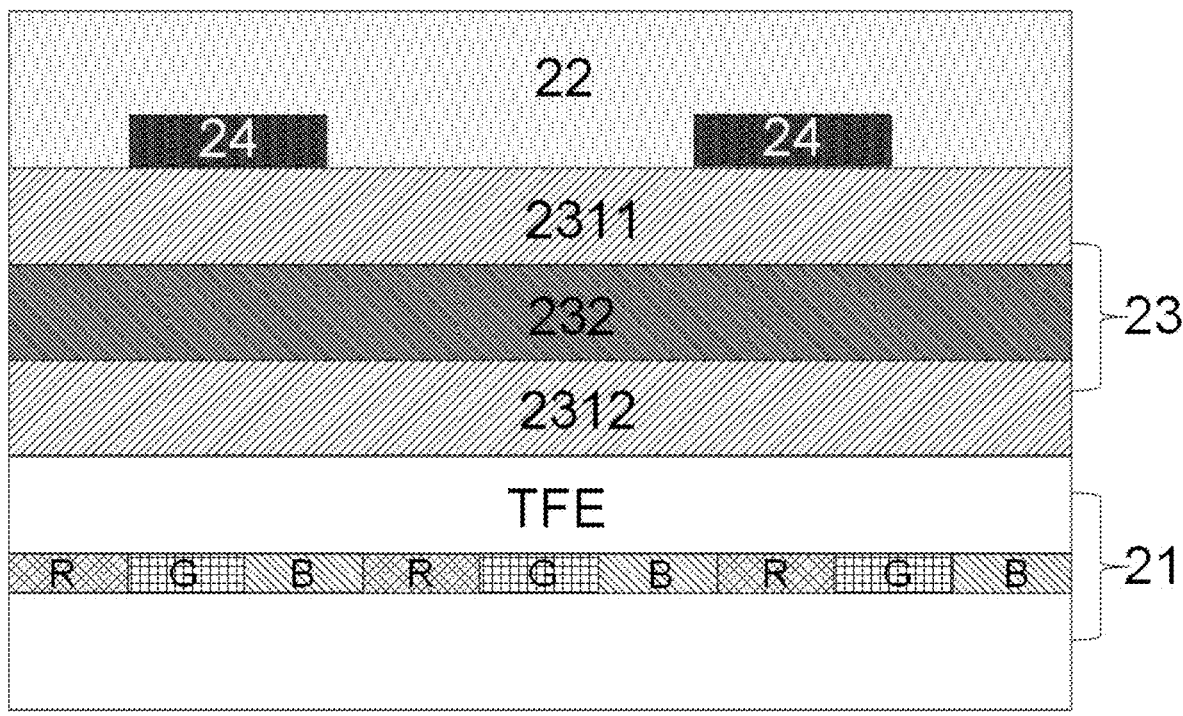

As shown in FIG. 9, an OLED display panel may include an array substrate 21, a circular polarizing plate 22, a first stack structure 23, and a touch-control electrode layer 24. The first stack structure 23 may include a first touch-control electrode substrate 2311, a second touch-control electrode substrate 2312, and a compensation film 232. In particular, the compensation film 232 may be sandwiched between the first touch-control electrode substrate 2311 and the second touch-control electrode substrate 2312.

Based on FIG. 9, the touch-control electrode layer 24 in the OLED display panel may also be located on one side of the first stack structure 23 facing away the circular polarizing plate 22. Optionally, the OLED display panel may also include two touch-control electrode layers 24, and the two touch-control electrode layers 24 (e.g., a first touch-control electrode layer 241 and a second touch-control electrode layer 242) may be disposed on one side of the first stack structure 23 facing towards the circular polarizing plate 22, and one side of the first stack structure 23 facing away the circular polarizing plate 22, respectively.

Other structures illustrated in FIG. 9 may be the same or similar to the aforementioned structures illustrated in FIG. 4, and are not described in detail herein. The material or thickness of each structure may be the same or similar to the aforementioned description, and is not described in detail herein.

On basis of the first stack structure 23 comprising two touch-control electrode substrates (e.g., the first touch-control electrode substrate 2311 and the second touch-control electrode substrate 2312), the first stack structure 23 may also include a plurality of compensation films 232. The number of the compensation films 232 may be, for example, two or three.

Figure 10:
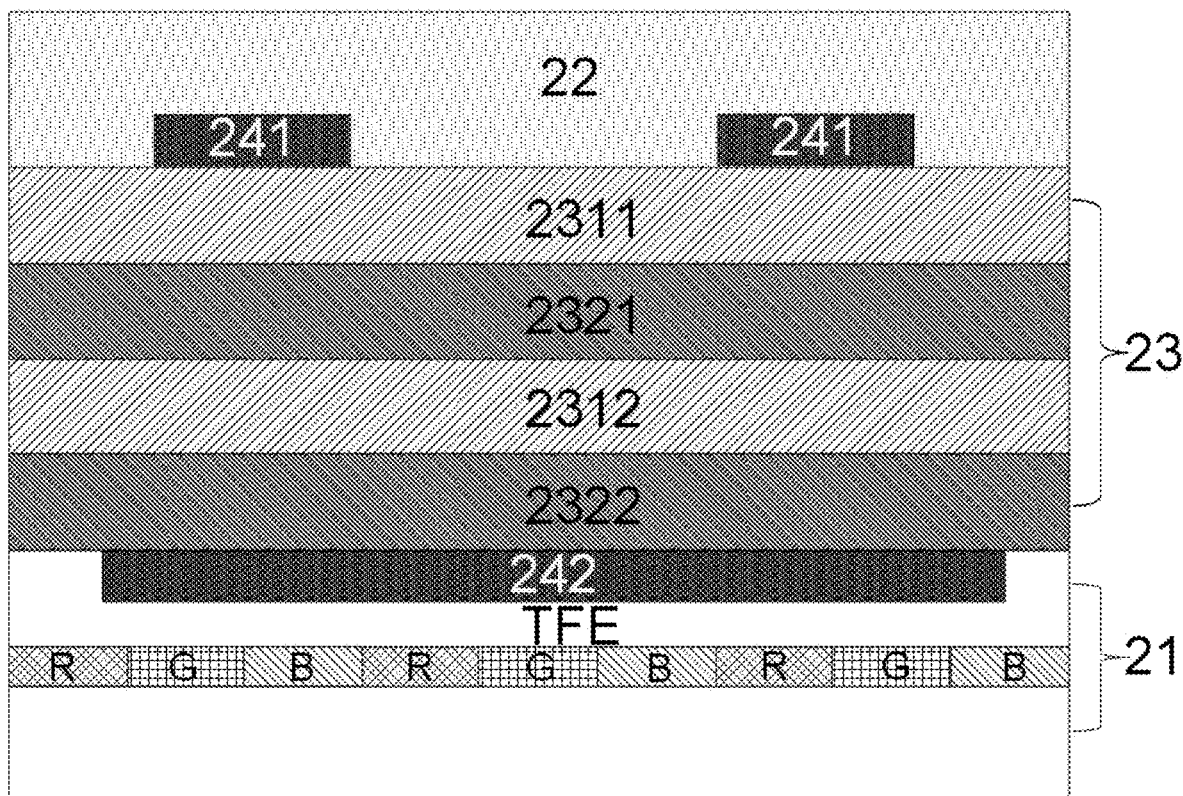

As shown in FIG. 10, an OLED display panel may include an array substrate 21, a circular polarizing plate 22, a first stack structure 23, and two touch-control electrode layers (i.e., a first touch-control electrode layer 241 and a second touch-control electrode layer 242). The first stack structures 23 may include two compensation films and two touch-control electrode substrates. More specifically, the two compensation films may include a first compensation film 2321 and a second compensation film 2322. The two touch-control electrode substrates may include the first touch-control electrode substrate 2311 and the second touch-control electrode substrate 2312.

In one embodiment, along a direction from the circular polarizing plate 22 to the array substrate 21, the first stack structure 23 may sequentially include a first touch-control electrode substrate 2311, a first compensation film 2321, a second touch-control electrode substrate 2312, and a second compensation film 2322.

Further, as shown in FIG. 10, the first touch-control electrode layer 241 may be disposed on one side of the first stack structure 23 facing towards the circular polarizing plate 22, and the second touch-control electrode layer 242 may be disposed on one side of the first stack structure 23 facing away the circular polarizing plate 22. In other embodiments, an OLED display panel may include only the first touch-control electrode layer 241, or only the second touch-control electrode layer 242.

Other structures illustrated in FIG. 10 may be the same as or similar to the aforementioned structures illustrated in FIG. 4, and are not described in detail herein. The material or thickness of each structure may be the same or similar to aforementioned descriptions, and is not described in detail herein.

Figure 11:
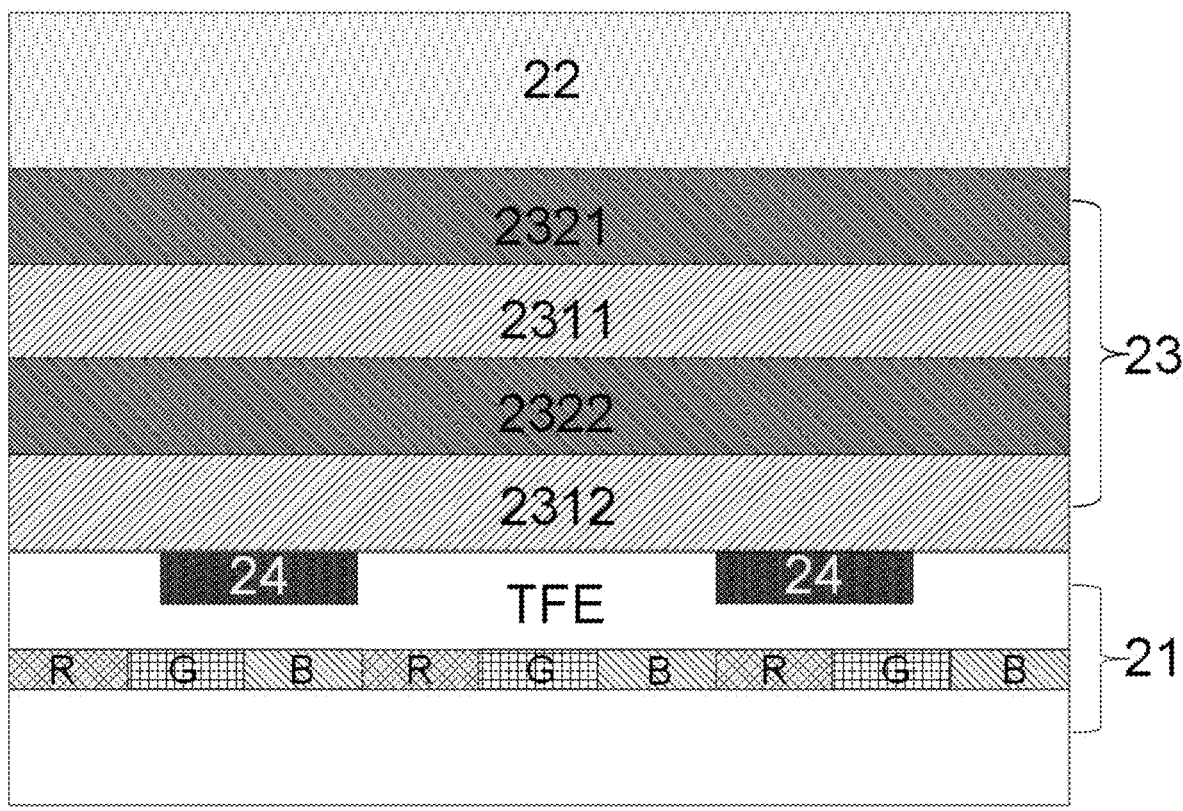

FIG. 11 illustrates an exemplary OLED display panel. As shown in FIG. 11, the OLED display panel may include an array substrate 21, a circular polarizing plate 22, a first stack structure 23, and two touch-control electrode layers. Further, similar to FIG. 10, the first stack structure 23 illustrated in FIG. 11 may also include two compensation films and two touch-control electrode substrates. Further, along a direction from the circular polarizing plate 22 to the array substrate 21, the first stack structure 23 may sequentially include the first compensation film 2321, the first touch-control electrode substrate 2311, the second compensation film 2322, and the second touch-control electrode substrate 2312.

Based on FIG. 11, optionally, the touch-control electrode layer 24 in the OLED display panel may also be disposed on one side of the first stack structure 23 facing towards the circular polarizing plate 22. Optionally, the OLED display panel may also include two touch-control electrode layers, and the two touch-control electrode layers may be disposed on one side of the first stack structure 23 facing towards the circular polarizing plate 22, and on one side of the first stack structure 23 facing away the circular polarizing plate 22, respectively.

Other structures illustrated in FIG. 11 may be the same or similar to aforementioned structures illustrated in FIG. 4 or other figures, and are not described in detail herein. The material or thickness of each structure may be the same or similar to aforementioned descriptions, and is not described in detail herein.

Figure 12:
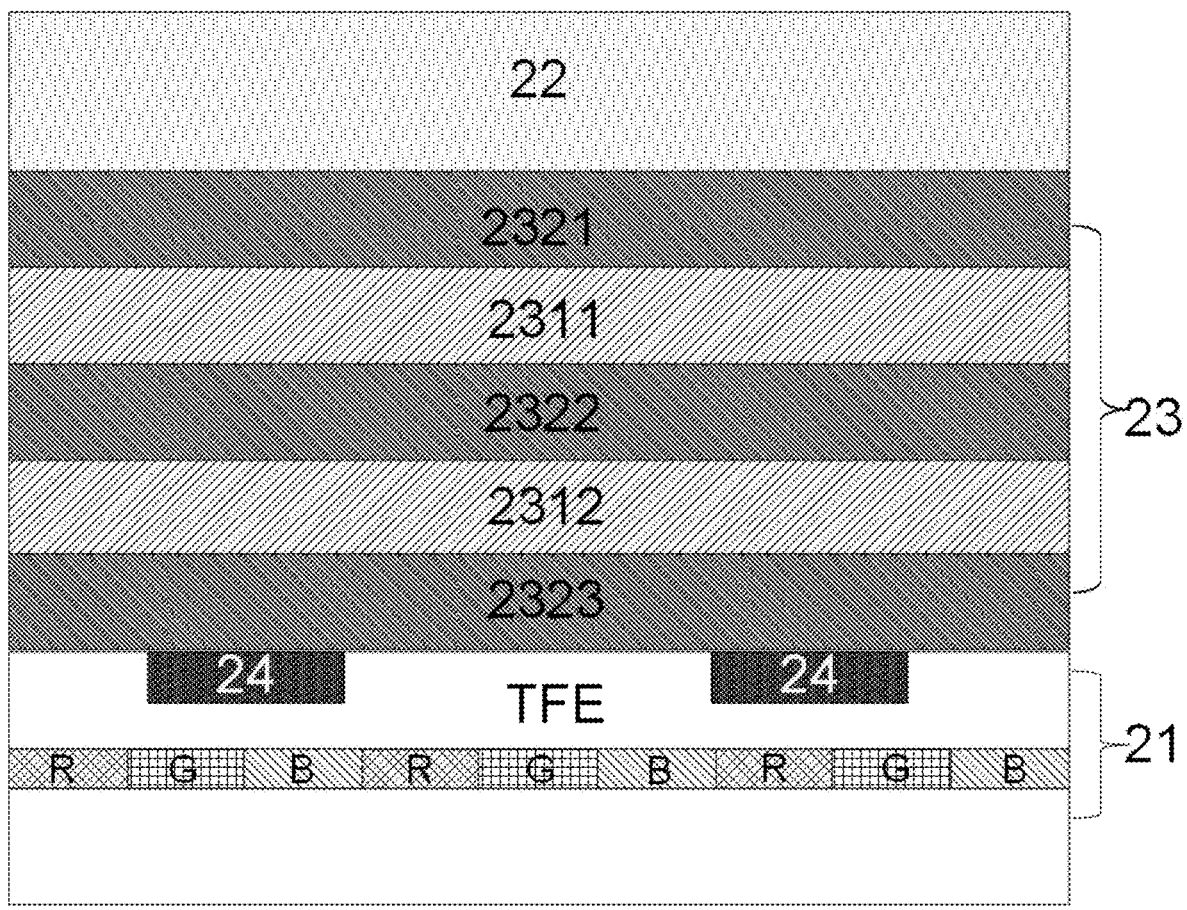

FIG. 12 illustrates an exemplary OLED display panel. As shown in FIG. 12, the OLED display panel may include an array substrate 21, a circular polarizing plate 22, a first stack structure 23, and a touch-control electrode layer 24. More specifically, the first stack structure 23 may include a first compensation film 2321, a first touch-control electrode substrate 2311, a second compensation film 2322, a second touch-control electrode substrate 2312, and a third compensation film 2323. That is, the first stack structure 23 may include three compensation films.

Based on FIG. 12, the touch-control electrode layer 24 in the OLED display panel may also disposed on one side of the first stack structure 23 facing towards the circular polarizing plate 22. Optionally, the OLED display panel may also include two touch-control electrode layers, and the two touch-control electrode layers may be disposed on one side of the first stack structure 23 facing towards the circular polarizing plate 22, and on one side of the first stack structure 23 facing away the circular polarizing plate 22, respectively.

Other structures illustrated in FIG. 12 may be the same as or similar to the aforementioned structures illustrated in FIG. 4 or other figures, and are not described in detail herein. The material or thickness of each structure may be the same as or similar to aforementioned descriptions, and is not described in detail herein.

Further, no matter how many touch-control electrode substrates and compensation films are included in each first stack structure illustrated in FIGS. 8-12, because the material of the touch-control electrode substrate may be PI or PET, the thickness of the first stack structure may be controlled to be thinner than that of an existing touch-control electrode substrate made of a COP material. Optionally, the total thickness of the first stack structure may be configured to be smaller than 50 μm to ensure that the thickness of the OLED display panel is relatively small, thereby satisfying the trend of fabricating thinner and lighter OLED display panels.

Figure 13:
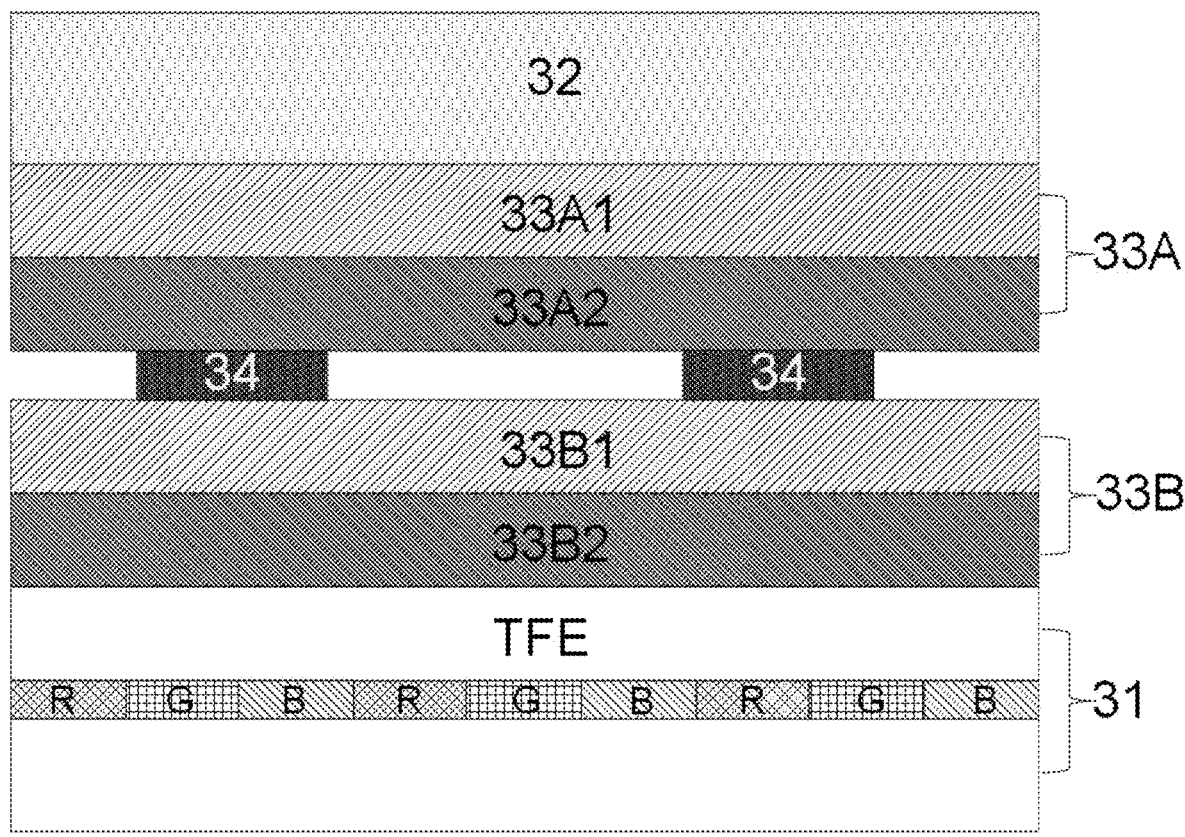

FIG. 13 illustrates another exemplary OLED display panel according to embodiments of the present disclosure. As shown in FIG. 13, the OLED display panel may include an array substrate 31, a circular polarizing plate 32, two stack structures, and a touch-control electrode layer 34. The two stack structures may include a first stack structure 33A and a second stack structure 33B.

In particular, the touch-control electrode layer 34 may be disposed between the first stack structure 33A and a second stack structure 33B. The first stack structure 33A may further include a first touch-control electrode substrate 33A1 and a first compensation film 33A2. The second stack structure 33B may further include a third touch-control electrode substrate 33B1 and a fourth compensation film 33B2.

Further, the first stack structure in FIG. 13 may be a structure including two touch-control electrode substrates and at least one first compensation film. The second stack structure may include at least one third touch-control electrode substrate and at least one fourth compensation film. The material of the first touch-control electrode substrate 33A may be the same as or different from the material of the third touch-control electrode substrate 33B1. The material of the first compensation film 33A2 may be the same as or different from the material of the fourth compensation film 33B2. The present disclosure is not limited thereto.

According to the present disclosure, the sum of the phase retardation of the touch-control electrode substrate and the compensation film in the first stack structure with respect to a beam of light at the same frequency may need to be smaller than or equal to 200 nm. Simultaneously, the sum of the phase retardation of the touch-control electrode substrate and the compensation film in the second stack structure with respect to a beam of light at the same frequency may need to be smaller than or equal to 200 nm.

Accordingly, at an inclined viewing angle, the phase retardation of the touch-control electrode substrate and the phase retardation of the compensation film may be counteracted, thereby reducing the impact on the polarization of the circularly-polarized light emitted from the circular polarizing plate. Thus, the reflection-reducing effect of the circular polarizing plate may not be affected.

Figure 15:
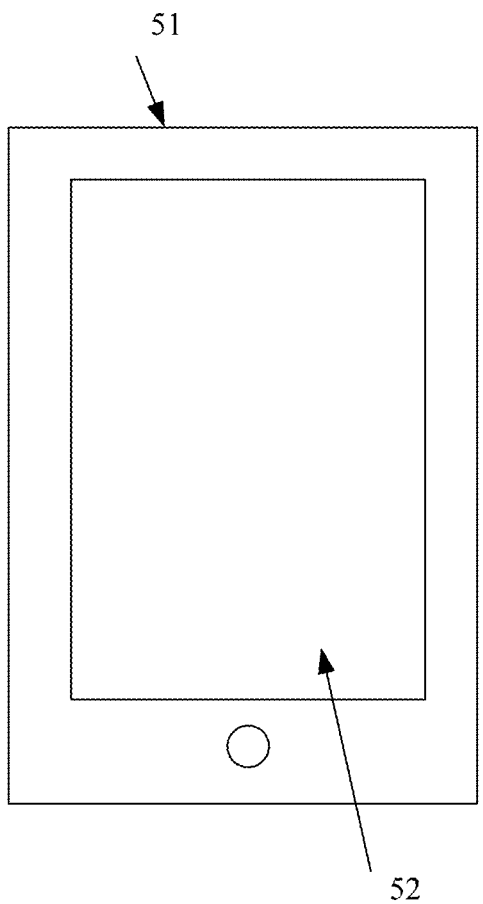
FIG. 15 illustrates an exemplary OLED display device according to embodiments of the present disclosure.

The present disclosure further provides an OLED display device. FIG. 15 illustrates an exemplary OLED display device 51 consistent with the disclosed embodiments. As shown in FIG. 15, the OLED display device 51 may be a tablet, a TV, a smartphone, a notebook, or a smart watch including an OLED display panel 52. The OLED display panel 52 may be any aforementioned OLED display panel. The OLED display panel may include an array substrate, a circular polarizing plate, a first stack structure, and a touch-control electrode layer.

More specifically, the first stack structure may be disposed between the circular polarizing plate and the array substrate. The touch-control electrode layer may be disposed on one side of the first stack structure facing towards or facing away the circular polarizing plate. The first stack structure may include a touch-control electrode substrate and a compensation film. In particular, the phase retardation of the touch-control electrode substrate and the compensation film with respect to a beam of light at the same frequency may be smaller than or equal to 200 nm.

Because one or more compensation film is used to compensate for the phase retardation of the touch-control electrode substrate, the phase retardation of the first stack structure may be relatively small. Accordingly, without affecting the reflection-reducing effect of the circular polarizing plate on the reflected light from a metal between the circular polarizing plate and the substrate of the array substrate in the OLED display panel, the reflection-reducing effect of the circular polarizing plate at an inclined viewing angle may be greatly improved.

Various embodiments of the specification are described in a narrative way, each embodiment highlights its difference from other embodiments, and the same or similar parts between various embodiments may refer to each other. For the disclosed device, because it corresponds to the disclosed method in the embodiments, thus the descriptions are relatively simple, and the related parts may be referred to the descriptions of the method.

The above descriptions of the disclosed embodiments are presented to enable any person skilled in the art to make or use the invention. Various modifications to the disclosed embodiments will be readily apparent to those skilled in the art, and the general principles defined herein may be applied to other embodiments without departing from the spirit and scope of the present disclosure. Thus, the present disclosure is not limited to the embodiments shown, but is to be accorded the widest scope consistent with the principles and novel features herein disclosed.

What is claimed is:

1. An OLED display panel,
comprising: an array substrate;
a circular polarizing plate disposed on one side of the array substrate;
a first stack structure disposed between the array substrate and the circular polarizing plate, the first stack structure comprising at least one touch-control electrode substrate and a first compensation film disposed directly on a surface of the at least one touch-control electrode substrate facing away the circular polarizing plate, a material of the at least one touch-control electrode substrate being polyimide with phase retardation greater than 300 nm; and
at least one touch-control electrode layer disposed on one side of the first stack structure facing towards the circular polarizing plate,
wherein at an inclined viewing angle:
a phase retardation of the at least one touch-control electrode substrate and a phase retardation of the first compensation film have approximate absolute values but opposite symbols, and
the phase retardation of the first compensation film counteracts the phase retardation of the touch-control electrode substrate to allow a sum of the phase retardation of the at least one touch-control electrode substrate and the first compensation film with respect to a beam of light at a same frequency to be smaller than the phase retardation of the touch-control electrode substrate and smaller than or equal to 50 nm that does not impact a reflection-reducing effect of the circular polarizing plate when viewed from an inclined angle.

2. The OLED display panel according to claim 1, wherein:
the first compensation film is made of a liquid crystal coating material.

3. The OLED display panel according to claim 1, wherein:
the first compensation film and the circular polarizing plate form an integral structure, and the first compensation film is formed on a surface of the circular polarizing plate.

4. The OLED display panel according to claim 1, wherein:
the first stack structure further includes a second compensation film.

5. The OLED display panel according to claim 4, wherein:
the second compensation film is disposed on one side of the at least one touch-control electrode substrate facing towards the circular polarizing plate.

6. The OLED display panel according to claim 1, wherein:
the at least one touch-control electrode substrate includes a first touch-control electrode substrate and a second touch-control electrode substrate.

7. The OLED display panel according to claim 6, wherein:
the first compensation film is disposed between the first touch-control electrode substrate and the second touch-control electrode substrate.

8. The OLED display panel according to claim 6, wherein:
the first stack structure further includes a second compensation film.

9. The OLED display panel according to claim 8, wherein:
along a direction from the circular polarizing plate to the array substrate, the first stack structure sequentially includes the first touch-control electrode substrate, the first compensation film, the second touch-control electrode substrate, and the second compensation film.

10. The OLED display panel according to claim 8, wherein:
along the direction from the circular polarizing plate to the array substrate, the first stack structure sequentially includes the first compensation film, the first touch-control electrode substrate, the second compensation film, and the second touch-control electrode substrate.

11. The OLED display panel according to claim 6, wherein:
the first stack structure further includes a second compensation film.

12. The OLED display panel according to claim 11, wherein:
along the direction from the circular polarizing plate to the array substrate, the first stack structure includes the first compensation film, the first touch-control electrode substrate, the second compensation film, and the second touch-control electrode substrate.

13. An OLED display panel, comprising:
an array substrate;
a circular polarizing plate disposed on one side of the array substrate;
a first stack structure disposed between the array substrate and the circular polarizing plate, the first stack structure including at least one touch-control electrode substrate and at least one compensation film disposed directly on a surface of the at least one touch-control electrode substrate facing away the circular polarizing plate, a material of the touch-control electrode substrate being polyimide with phase retardation greater than 300 nm;
a second stack structure including at least a third touch-control electrode substrate and at least one fourth compensation film; and
a touch-control electrode layer is disposed between the first stack structure and the second stack structure,
wherein at an inclined viewing angle:
a phase retardation of the third touch-control electrode substrate and a phase retardation of the at least one fourth compensation film have approximate absolute values but opposite symbols, and
the phase retardation of the first compensation film counteracts the phase retardation of the touch-control electrode substrate to allow a sum of the phase retardation of the third touch-control electrode substrate and the at least one fourth compensation film with respect to a beam of light at a same frequency to be smaller than the phase retardation of the touch-control electrode substrate and smaller than or equal to 50 nm so that a reflection-reducing effect of the circular polarizing plate when viewed from an inclined angle is not impacted.

14. The OLED display panel according to claim 13, wherein:
the compensation film is made of a liquid crystal coating material.

15. An OLED display device comprising an OLED display panel, wherein the OLED display panel comprises:
- an array substrate;
- a circular polarizing plate disposed on one side of the array substrate;
- a first stack structure disposed between the array substrate and the circular polarizing plate, the first stack structure comprising at least one touch-control electrode substrate and at least one compensation film disposed directly on a surface of the at least one touch-control electrode substrate facing away the circular polarizing plate, a material of the touch-control electrode substrate being polyimide with phase retardation greater than 300 nm; and
- at least one touch-control electrode layer disposed on one side of the first stack structure facing towards the circular polarizing plate, wherein at an inclined viewing angle:
- a phase retardation of the at least one touch-control electrode substrate and a phase retardation of the at least one compensation film have approximate absolute values but opposite symbols, and
- the phase retardation of the at least one compensation film counteracts the phase retardation of the touch-control electrode substrate to allow a sum of the phase retardation of the at least one touch-control electrode substrate and the at least one compensation film with respect to a light beam at a same frequency to be smaller than the phase retardation of the touch-control electrode substrate and smaller than or equal to 50 nm that does not impact a reflection-reducing effect of the circular polarizing plate when viewed from an inclined angle.

* * * * *